United States Patent [19]

Furuki

[11] Patent Number: 5,384,493
[45] Date of Patent: Jan. 24, 1995

[54] HI-SPEED AND LOW-POWER FLIP-FLOP
[75] Inventor: Katsuya Furuki, Tokyo, Japan
[73] Assignee: NEC Corporation, Tokyo, Japan
[21] Appl. No.: 956,249
[22] Filed: Oct. 5, 1992

[30] Foreign Application Priority Data

Oct. 3, 1991 [JP] Japan .................................. 3-256123
Jan. 13, 1992 [JP] Japan .................................. 4-003946

[51] Int. Cl.[6] ...................... H03K 3/356; H03K 3/289
[52] U.S. Cl. .................................. 327/203; 327/212; 327/215; 326/95
[58] Field of Search ...................... 307/272.2, 291, 279, 307/480, 481, 482, 482.1, 272.1, 288; 328/206; 365/154; 377/116, 115, 117, 74

[56] References Cited

U.S. PATENT DOCUMENTS

| 3,610,965 | 10/1971 | Martin | 302/272.2 |
| 4,039,960 | 12/1977 | Clark | 307/480 |
| 4,438,351 | 3/1984 | Schuermeyer | 307/272.2 |
| 4,851,710 | 7/1989 | Grivna | 307/480 |
| 5,036,217 | 7/1991 | Rollins et al. | 307/291 |
| 5,192,333 | 3/1993 | Nakano | 302/291 |
| 5,245,223 | 9/1993 | Lim et al. | 307/272.1 |

FOREIGN PATENT DOCUMENTS

| 0129430 | 10/1981 | Japan | 307/480 |
| 0145721 | 8/1985 | Japan | 307/279 |
| 0150314 | 8/1985 | Japan | 307/279 |

OTHER PUBLICATIONS

Y. Suzuki, "Clocked CMOS Calculator Circuitry", IEEE, Journal of Solid-State Circuits, vol. SC-8, No. 6, Dec. 1973, pp. 462-469.
Heller et al., "Cascade Voltage Switch Logic: A Differential CMOS Logic Family", 1984 IEEE International Solid-State Circuits Conference, Feb. 22, 1984, pp. 16-17.

Primary Examiner—Timothy P. Callahan
Assistant Examiner—Dinh Le
Attorney, Agent, or Firm—Sughrue, Mion, Zinn, Macpeak & Seas

[57] ABSTRACT

A semiconductor integrated circuit comprises a pair of complementary groups of MOS transistors disposed between first and second reference potentials and switched on and off through a pair of complementary groups of input signals inputted to gates thereof, a first switching transistor switched on and off by a clock signal, and a pair of cross-connected second switching transistors disposed between the reference potentials and connected with the pair of groups of MOS transistors. With this construction, unlike prior art techniques, the semiconductor integrated circuit of the present invention operates with greater speed and reduced power consumption, without increasing the channel width of the constituent transistor, and without the need for an inverted clock signal.

12 Claims, 12 Drawing Sheets

PRIOR ART

HI-SPEED AND LOW-POWER FLIP-FLOP

BACKGROUND OF THE INVENTION

1. Field of the Invention

The present Invention relates to a semiconductor integrated circuit, and more specifically to a CMOS dynamic semiconductor integrated circuit.

2. Description of the Prior Art

As illustrated in FIG. 1, a prior art semiconductor integrated circuit comprises an N type transistor Q6, a first logical circuit section 1k, a P type transistor Q7, and a second logical circuit section 1m. transistor Q6 has a source electrode connected to a first reference potential GND (earth potential) and is switched on and off by allowing a clock signal CLK to be inputted to a gate electrode thereof. The first logical circuit section 1k includes a plurality of N type second transistors that are switched on and off by allowing input signals IN1 through INn to be inputted to gate electrodes thereof correspondingly. These transistors are connected between a drain electrode of the transistor Q6 and an output terminal OUT to connect and disconnect the drain electrode of the transistor Q6 and the output terminal OUT with and from each other in conformity with a predetermined logic for the first input signals IN1 through 1Nn. The P type first transistor Q7 has a source electrode connected to a second reference potential VDD (power supply potential point) and is switched on and off by allowing an inverted clock signal CLKb to be inputted to a gate electrode thereof. The second logical circuit section 1m includes a plurality of P type transistors that are switched on and off by allowing the input signals IN1 through INn to be inputted to gate electrodes thereof correspondingly. The logical section 1m is connected between a drain electrode of the transistor Q7 and the output terminal OUT to connect and disconnect the drain electrode of the transistor Q7 and the output terminal OUT with and from each other in a complementary manner with respect to the first logical circuit section 1k, as disclosed in IEEE J, Solid-State Circuit, 1973, pp 462 to 469, "Clocked CMOS Calculator Circuitry".

In the aforementioned semiconductor integrated circuit, the transistors Q6, Q7 are switched on when the clock signal CLK is of a high level. Thereupon, either the logical circuit section 1m composed of the group of P type transistors or the logical circuit section 1k composed of the group of the N type transistors is switched on in conformity with the levels of the input signals IN1 through INn, and hence the output OUT becomes a high or low level. The operation described above is the same as in typical CMOS circuits. When the output signal OUT changes from a high to low level, a conduction path is formed in the logical circuit section 1k between the output terminal and the earth potential through the N type transistors while electrical disconnection is formed between the output terminal and the power supply potential owing to the P type transistors in the logical circuit section 1m. Reverse operation is performed when the output signal OUT is reversed, i.e., from the low to high level. The speed of the just-mentioned change depends upon the capabilities of the associated transistors (channel widths of the transistors).

Once the clock signal CLK goes to low level, the transistors Q6 and Q7 are switched off so that the output terminals are electrically disconnected and isolated from the power supply potential and from the earth potential. At this time, the output signal at the output terminal OUT is kept dynamic in its level immediately before the clock signal CLK is changed to the low level through capacitance connected with the output terminal without depending upon the levels of the input signals IN1 through INn.

In order to speed up the operation of the foregoing semiconductor integrated circuit, it is necessary to increase the channel widths of the transistors of the logical circuit sections 1k and 1m, which causes the input capacitance to be increased.

Such a prior art semiconductor integrated circuit is arranged to drive the two transistors of the logical circuit sections 1k, 1m with use of a single input signal and hence has a drawback that the input capacitance is increased, provided the channel widths of the transistors are widened for the high speed operation. It is therefore required to increase the capabilities of a previous stage driver circuit serving to drive the logical circuit sections 1k, 1m, resulting in the additional problem of increased power consumption. As a result, therefore, it is difficult to obtain the high speed operation. Further, such a prior art semiconductor integrated circuit suffers from a still another difficulty: The inverted clock signal CLKb is required in addition to the clock signal CLK.

Referring to FIG. 2, there is illustrated a second prior art semiconductor integrated circuit which is arranged in the same fashion as in the case of FIG. 1, except that the first transistors Q6, Q7 switched on and off by the clock signals CLK and CLKb are disposed between the logical circuit sections 1m and 1k composed of the second transistors with the output terminal OUT disposed therebetween. Operation of the second prior art example is also the same as in the first case illustrated in FIG. 1. More specifically, when the clock signal CLK is at a high level, the N channel type MOS transistor Q6 and the P channel type MOS transistor Q7 are switched on. At this time, the constituent MOS transistors of the channel P type MOS in the logical circuit section 1m and of the channel N type in the logical circuit section 1k are switched on or off according to the signal levels of the input signal group IN1 through INn to allow the circuit to output a high or low level signal. The operation here is that of a typical CMOS circuit. When the output is changed from the high to low level, a conduction path is formed between the output terminal and the GND electrode owing to the channel N type MOS transistors while electrical disconnection occurs between the output terminal and the VDD electrode. The situation is reversed when the output is changed from the low to high level. Speed of change depends upon the capability of each MOS transistor (channel width of the MOS transistor).

Once the clock signal CLK changes to the low level, the channel N type MOS transistor Q6 and the channel P type MOS transistor Q7 are switched off, so that the circuit is electrically isolated from VDD and GND. At this time, the output is kept dynamic through the capacitance of the output terminal immediately before the clock signal CLK changes to the low level without depending upon the signal levels of the input signal group IN1 through INn.

Also in the prior art semiconductor integrated circuit and likewise the first prior art example, the channel width of each MOS transistor must be widened, causing the input capacitance to be increased, in order to speed up the operation. With the input capacitance so increased, the retardation of signals inputted to the present circuit (input signal group IN1 through INn, clock signal CLK, and inverted clock signal CLKb) will increase. In order to reduce the retardation, the driving capability of a circuit serving to generate such signals must be increased. With the input capacitance increased, electric power consumed by the circuit serving to generate such signal is increased. Since the input signal group IN1 through INn is inputted to both the channel P type MOS transistor group of the logical circuit section 1m and the channel N type MOS transistor group of the logical circuit section 1k, the circuit is severely affected by widening the channel widths of the foregoing transistors.

Furthermore, not only the clock signal CLK, but also the inverted clock signal CLKb is required in order to control the operation state.

SUMMARY OF THE INVENTION

In order to solve the difficulties with the prior art techniques, it is therefore an object of the present invention to provide a semiconductor integrated circuit which provides high speed operation and is capable of reducing power consumption without requiring the inverted clock signal.

To achieve the above object, a semiconductor integrated circuit according to the present invention comprises:

(a) a complementary pair of groups of MOS transistors, each paired group of those transistors being composed of a group of first conductivity type MOS transistors, and each paired group of those transistors being disposed in parallel between a first reference potential and a second reference potential and being switched on and off in conforming with a predetermined logic by allowing a pair of groups of input signals to be inputted to gates of said constituent transistors, said paired groups of the input signals being complementary correspondingly to said paired groups of the MOS transistors;

(b) one or two first switching transistors being connected with said pair of the parallel MOS transistor groups or connected directly with each of the paired MOS transistor groups between the first reference potential and the second reference potential, and being switched on and off by a kind of a clock signal; and (c) a pair of second switching transistors being disposed between the first reference potential and the second transistor reference and each paired second switching being connected directly with each transistor group of said pair of the parallel MOS transistor groups, said second switching transistors including a pair of electrode terminals as output terminals of the present device located on the side of said pair of the MOS transistor groups, and including gates thereof, each gate being connected with one of said paired MOS transistor groups located on the complementary opposite side thereto through said one or two switching transistors or connected directly with the same, and further including electrode terminals located on the opposite sides to said output side terminals, the electrode terminals being connected with either said first reference potential or said second reference potential.

In accordance with the aforementioned semiconductor integrated circuit, the first switching transistor or transistors is or are switched on when the clock signal is of the high level, and once the complementary input signal groups are inputted to the gates of the complementary MOS transistor groups, the one paired group of the MOS transistor groups is electrically connected to the second reference potential and the other paired group is electrically unconnected to the second reference potential. Accordingly, for examples the one output terminal connected to said one MOS transistor group of the output terminals becomes low level. Further, the transistor of the second switching transistors located on the side of said other MOS transistor group is switched on because its gate is connected with said one output terminal. The other output terminal therefore goes to the high level; the other transistor of the second switching transistors is thus switched off. Between the first reference potential and the second reference potential, there are formed in such a manner electrical paths through the one second switching transistor and the one MOS transistor group and through the other second switching transistor and the other MOS transistor group, both being complementary to the former ones, Each electric path is only connected with any of the reference potentials and therefore any stationary current is prevented from flowing through those electric paths.

When the clock signal is of low level, the first switching transistor stays at an off state. Accordingly, the output terminals are electrically disconnected from the second reference potential whatever the levels of the input signal group are. It is therefore impossible to change the output terminals to the low level. The second switching transistor can not be changed in its conduction state by the input signals. Thus, the output terminals are kept dynamic with capacitances possessed by the output terminals at a level just short of the clock signals changing from the high to low level.

The above and other objects, features, and advantages of the present invention will become more apparent from the following description when taken in conjunction with the accompanying drawings.

DETAILED DESCRIPTION OF THE PREFERRED EMBODIMENTS

There will be described below the first embodiment of the semiconductor integrated circuit of the present invention.

Figure 1:
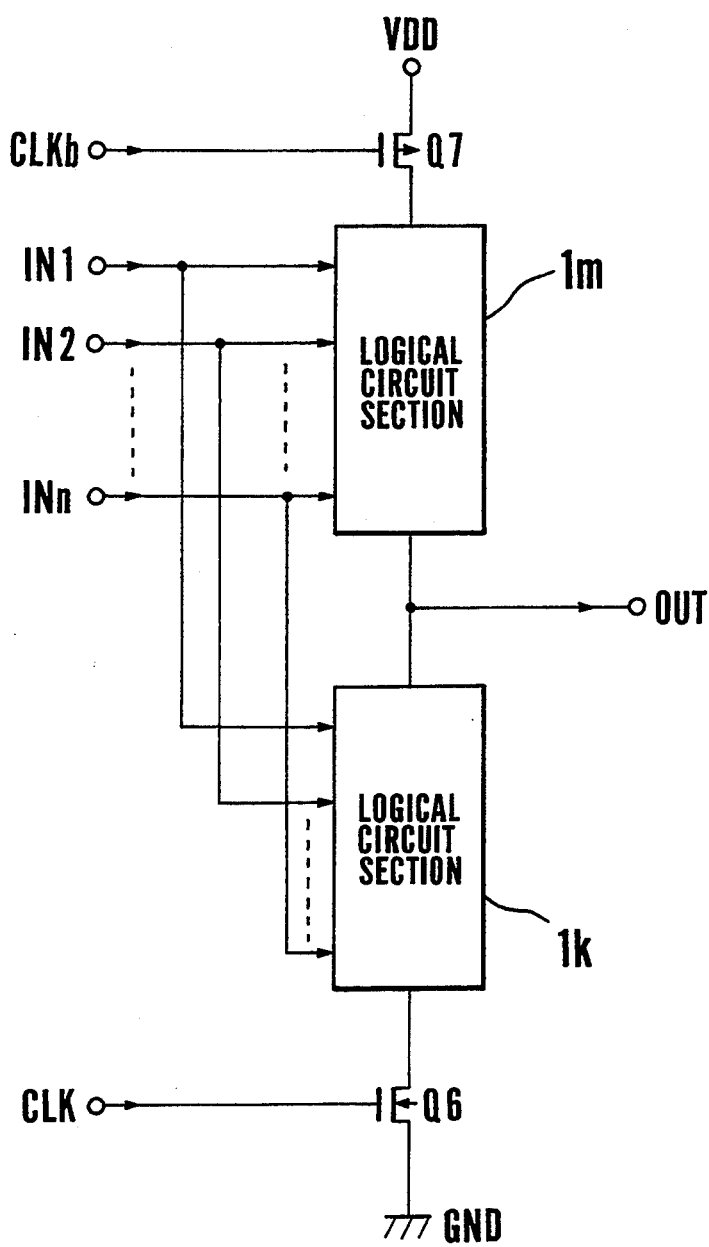
FIG. 1 is a circuit diagram illustrating a prior art semiconductor integrated circuit.
Figure 2:
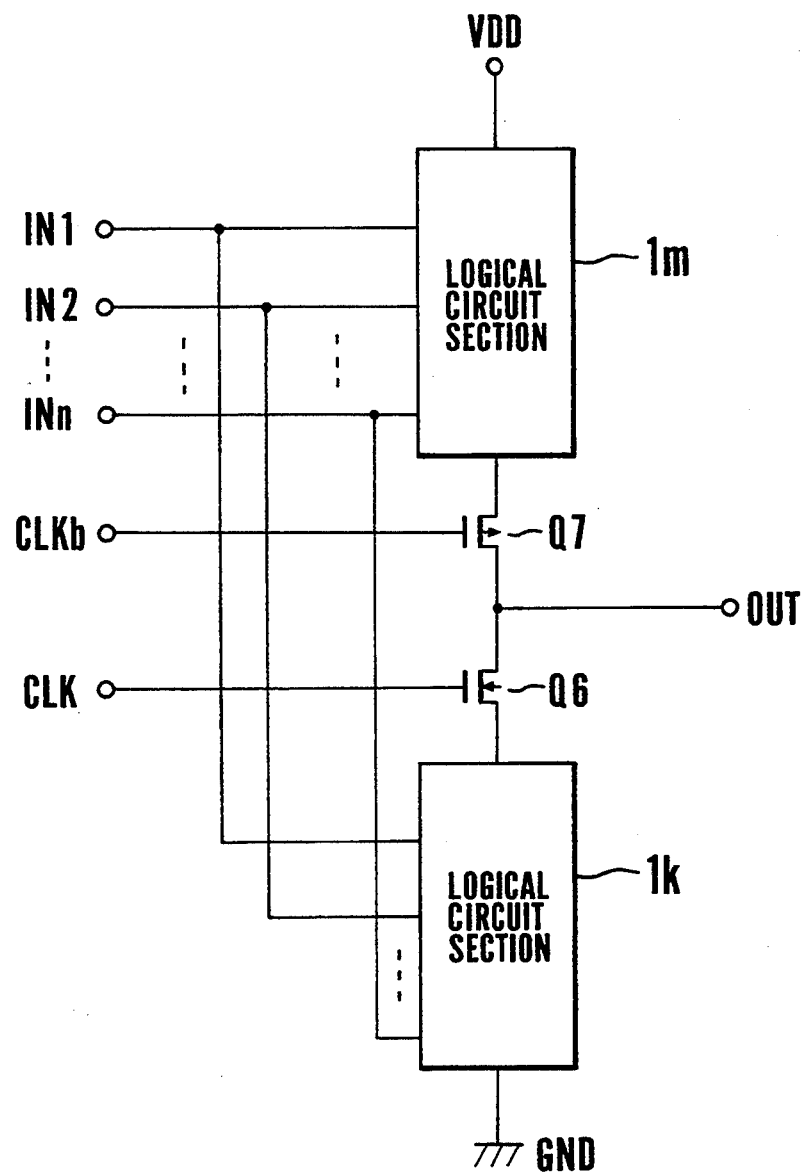
FIG. 2 is a circuit diagram illustrating another prior art semiconductor integrated circuit.
Figure 3:
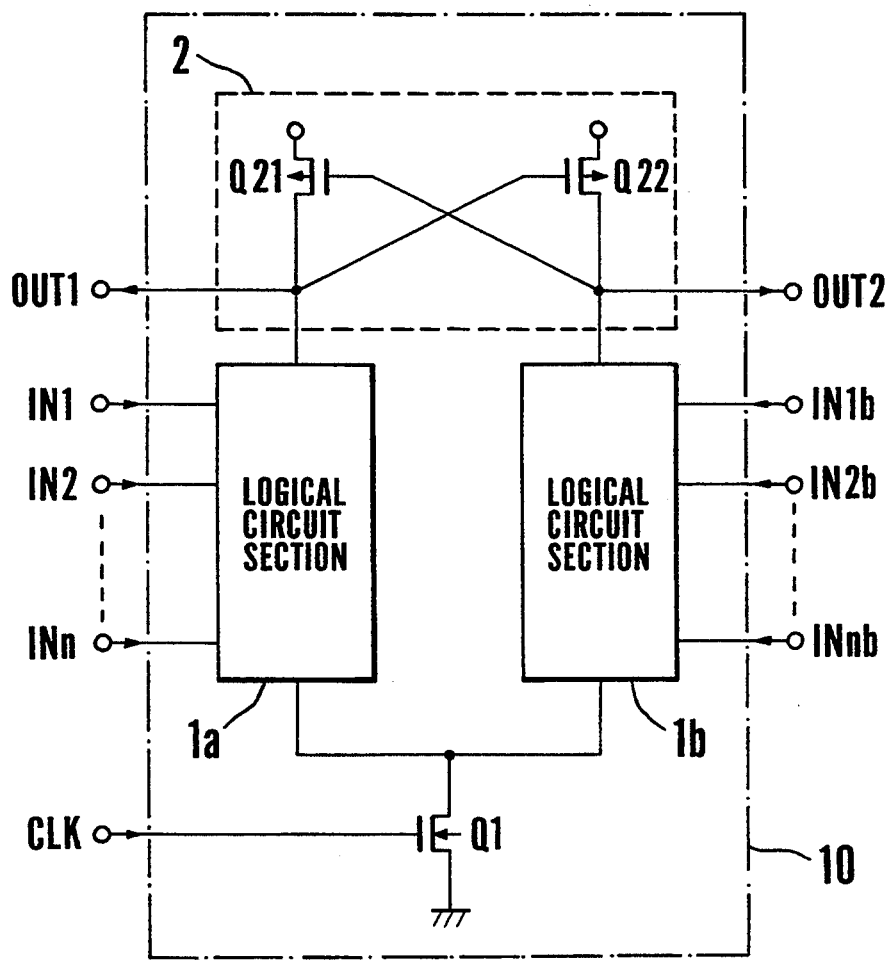
FIG. 3 is a circuit diagram illustrating a first embodiment of a semiconductor integrated circuit according to the present invention.

Referring now to FIG. 3, the first embodiment is illustrated in the form of the circuit diagram. The first embodiment comprises an N type first transistor Q1 connected at its source electrode to a first reference potential (earth potential) and switched on and off by inputting a clock signal CLK to a gate electrode thereof, a first logical circuit section 1a including a plurality of N type second transistors each switched on and off by inputting first input signals IN1 through INn to corresponding gate electrodes thereof, said first logical circuit section 1a being connected with a drain electrode of the first transistor Q1 and a first output terminal OUT1 for electrically connecting and disconnecting the drain electrode of the first transistor Q1 with the first output terminal OUT1 in conformity with a predetermined logic for the first input signals IN1 through INn, a second logical circuit section 1b including a plurality of N type third transistors each switched on and off by inputting to gate electrodes thereof second input signals IN1b through INnb corresponding to said gate electrodes and possessing logical levels complementary to the first input signals IN1 through INn, said second logical circuit section 1b being connected between the drain electrode of the first transistor Q1 and the second output terminal OUT 2 for electrically connecting and disconnecting the drain electrode of the first transistor Q1 with the second output terminal OUT 2 complementary to the first logical circuit section 1a, and a unit integrated circuit 10 including a load circuit 2 composed of a P type first transistor Q21 having its source electrode connected with the second reference potential (power supply potential), its drain electrode connected with the first output terminal OUT1, and its gate electrode connected with the first output terminal OUT1, and of a P type second transistor Q22 having its source electrode connected with the second reference potential (power supply potential), its drain electrode connected with the second output terminal OUT2, and its gate electrode connected with the first output terminal OUT1.

Operation of the first embodiment is as follows.

Figure 4:
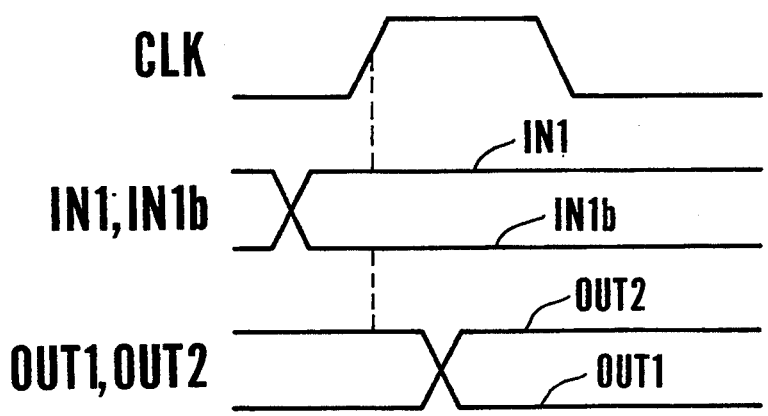
FIG. 4 is a timing chart illustrating the operation of the first embodiment of FIG. 1.

Referring to FIG. 4, a timing chart for signals at the respective constituent parts described above is exhibited to explain the operation of the first embodiment.

When the clock signal CLK is at a high level, the transistor Q1 keeps its on state. Thereupon, either one of the logical circuit sections 1a and 1b forms a conduction path between the one output terminal and the earth potential while the other logical circuit section is electrically disconnected, depending upon the levels of the input signals IN1 through INn and IN1b through INnb. Herein, the logical circuit section 1a is assumed to be a conduction state while the logical circuit section is 1b is assumed to be a disconnection state. Since the output terminal OUT1 is electrically connected with the earth potential, it becomes the low level. Further, since the transistor Q22 has been connected with the output terminal OUT1, it becomes the on state. Accordingly, since the output terminal OUT2 has electrically been disconnected from the earth potential owing to the presence of the logical circuit section 1b, it becomes the high level. Hereby, the transistor Q21 is brought into an off state. Thus, two paths are formed between the power supply potential and the earth potential; one through the transistor Q21 and the logical circuit section 1a and the other through the transistor Q22 and the logical circuit section 1b. Both paths have however, been electrically disconnected, so that no steady state current flows.

When the clock signal CLK is at the low level, the transistor Q1 stays at the off state. Accordingly, the respective output terminals OUT1 and OUT2 are brought into an electrical disconnection state from the earth potential without depending upon the levels of the input signals IN1 through INn and IN1b through INnb. Thus, the output terminals OUT1, OUT2 are incapable of being changed to the low level. Further, the P channel type MOS transistors Q21, Q22 are incapable of being changed in their conduction states owing to the input signal groups IN and INb. Thus, the respective output terminals OUT1 and OUT2 keep dynamic their levels just short of the clock signal CLK being changed from the high to low level through the capacitance connected thereto.

In the present embodiment, a previous stage driver circuit may drive one transistor of the logical circuit sections 1a and 1b for one input signal, whereby high speed operation is ensured together with low power consumption. Additionally, in accordance with the present embodiment an inverted clock signal CLKb is not required.

Figure 5:
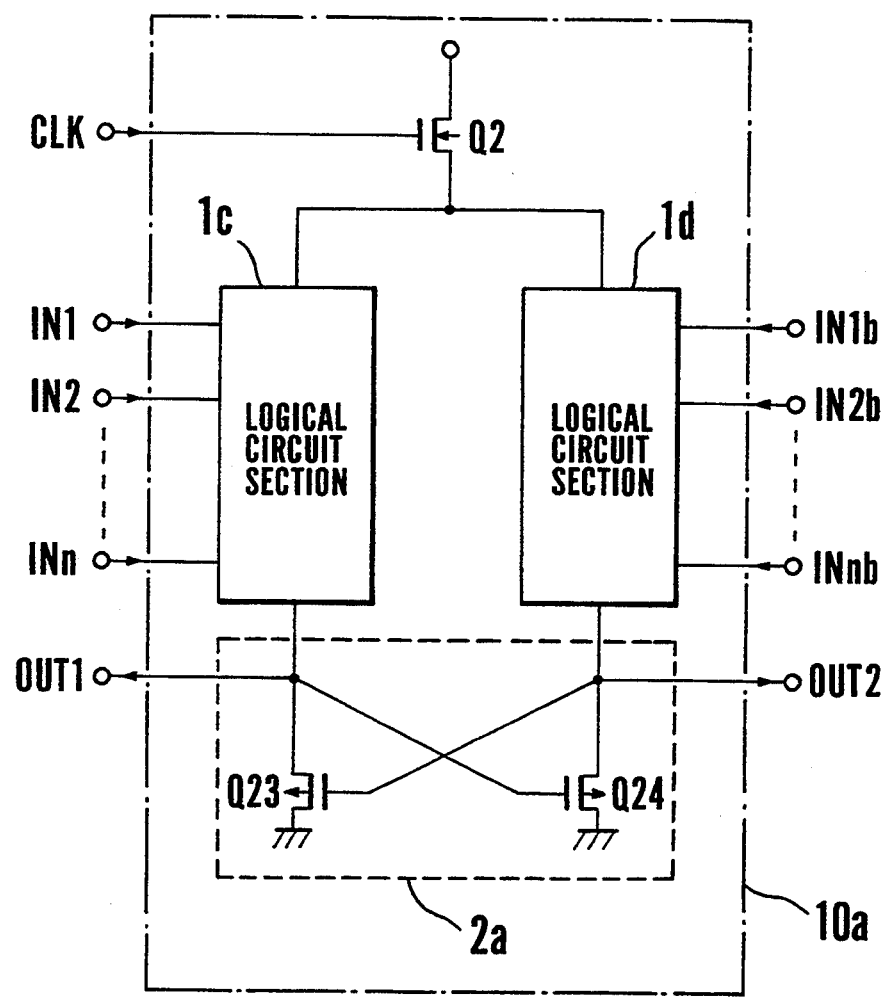
FIG. 5 is a circuit diagram illustrating a modification of the first embodiment.

Referring to FIG. 5, there is illustrated a circuit diagram of a modification of the first embodiment. The modification is arranged such that the first reference potential is assumed to be a power supply potential with the second reference potential assumed to be an earth potential and such that the one conductivity type is assumed to be a P type with the opposite conductivity type assumed to be an N type. The modification manifests the identical basic operation and effect with those of the first embodiment.

Figure 6:
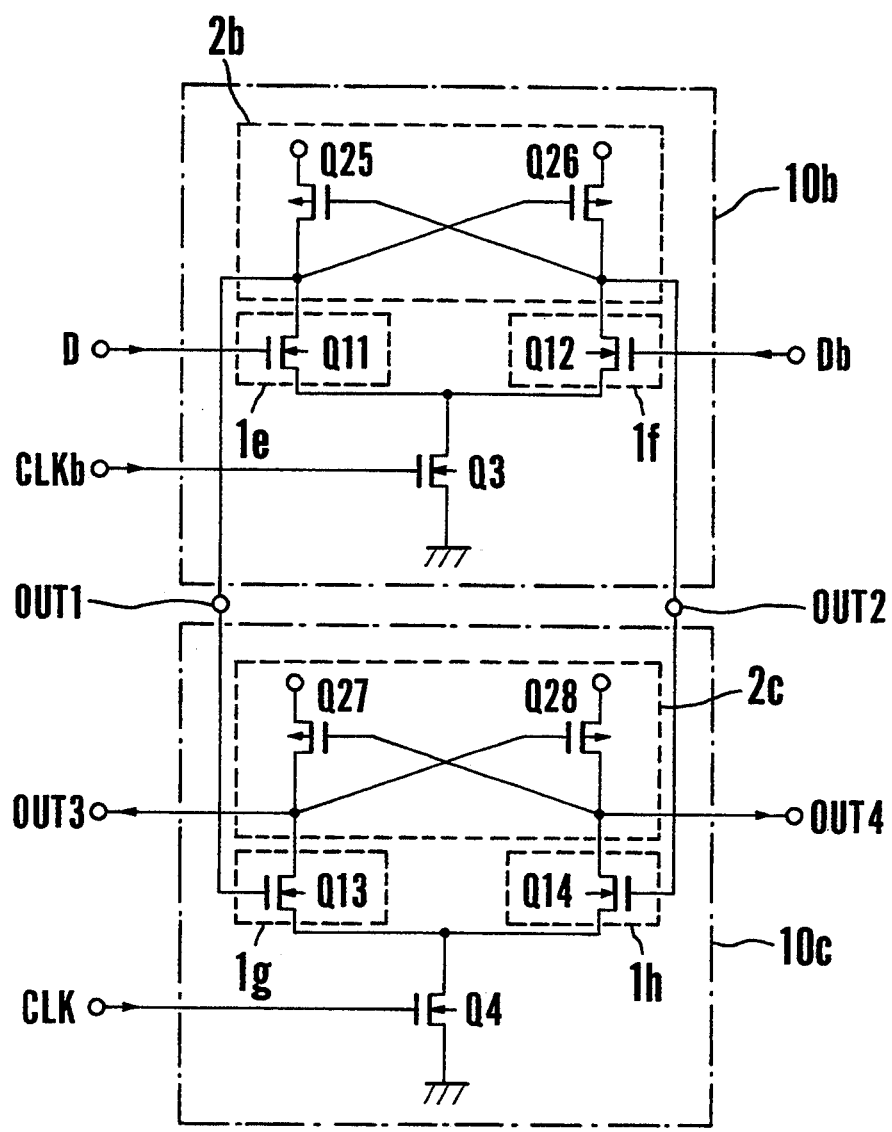
FIG. 6 is a circuit diagram illustrating a D flip-flop constructed by cascade-connection of the two first embodiment circuits.

Referring to FIG. 6, there is illustrated a circuit diagram of an application of the first embodiment to a D flip-flop construction. The modification constructs the logical circuit sections respectively with transistors Q11, Q12, Q13 and Q14 as logical circuit sections 1e, 1f, 1g and 1h. A unit integrated circuit including the logical circuit sections 1e and if is designated at 10b with a unit integrated circuit including the logical circuit sections 1g and 1h designated at 10c. Further, output signals at the output terminals OUT1 and OUT2 of the unit integrated circuit 10b are fed to the unit integrated circuit 10c as the input signal to the same. Additionally, the clock signals inputted to the gate electrodes of the transistors Q3 and Q4 are inverted in the one thereof to form phases opposite to each other.

Operation of the D flip-flop as shown is as follows;

When the clock signal CLK is of the low level, the unit integrated circuit 10b is activated and delivers output signals on the output terminals OUT1 and OUT2 in conformity with the input signals D and Db. Thereupon, the unit integrated circuit 10c keeps levels of previous period output signals on the output terminals OUT3 and OUT4 without depending upon the levels of the output signals on the output terminals OUT1 and OUT2 because the transistor Q4 is in an off state. Once the clock signal CLK changes to the high level, the unit integrated circuit 10c delivers output signals on the output terminals OUT3 and OUT4 following the levels of the output signals on the output terminals OUT1 and OUT2 at that time. Thereupon, even if the levels of the input signals D and Db are changed, the unit integrated circuit 10b keeps the levels of the output signals on the output terminals OUT1 and OUT2 in conformity with the levels of the input signals D and Db just short of the clock signal CLK changing to the high level. Thus, when the clock signal CLK is of the high level, the levels of the output signals on the output terminals OUT3 and OUT4 even if the levels of the input signals D and Db are changed.

In this manner, a D flip-flop is constructed as described above by cascade-connection of the two unit integrated circuits of the first embodiment.

Figure 7:
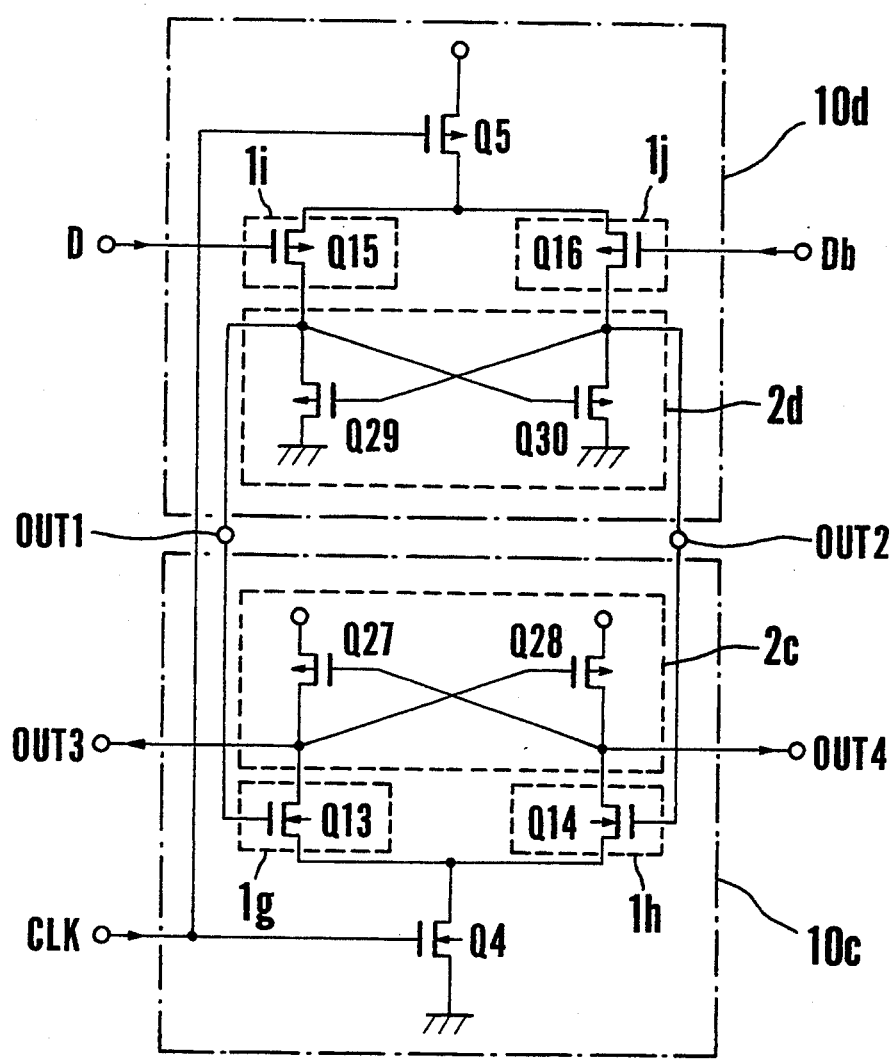
FIG. 7 is a circuit diagram illustrating a D flip-flop formed in combination of the first embodiment shown in FIG. 3 and the modification of the same shown in FIG. 5.

Referring to FIG. 7, there is illustrated a circuit diagram of an application of a D flip-flop in combination of the first embodiment shown in FIG. 3 and the modification with the same shown in FIG. 5. In the above application, the unit integrated circuit 10b of the application of FIG. 6 is replaced by a unit integrated circuit 10d wherein the logical circuit sections of the modification of FIG. 5 are constructed with transistors Q15 and Q16, respectively, as logical circuit sections 1i and 1j.

In the present application, the conductivity type of the transistors Q4 and Q5, each serving to control the activation of the unit integrated circuits 10c and 10d, is chosen so that those transistors are advantageously controllable by a common clock signal CLK without the need of an inverted clock signal CLKb.

Figure 8:
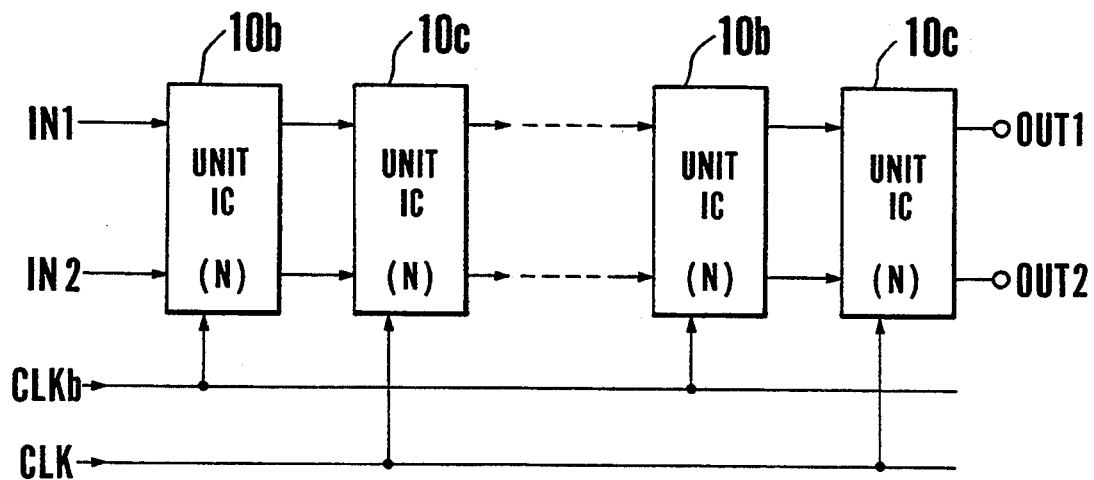
FIG. 8 is a circuit diagram illustrating a pipeline arrangement constructed by cascade-connection of the D flip-flop of FIG. 6.
Figure 9:
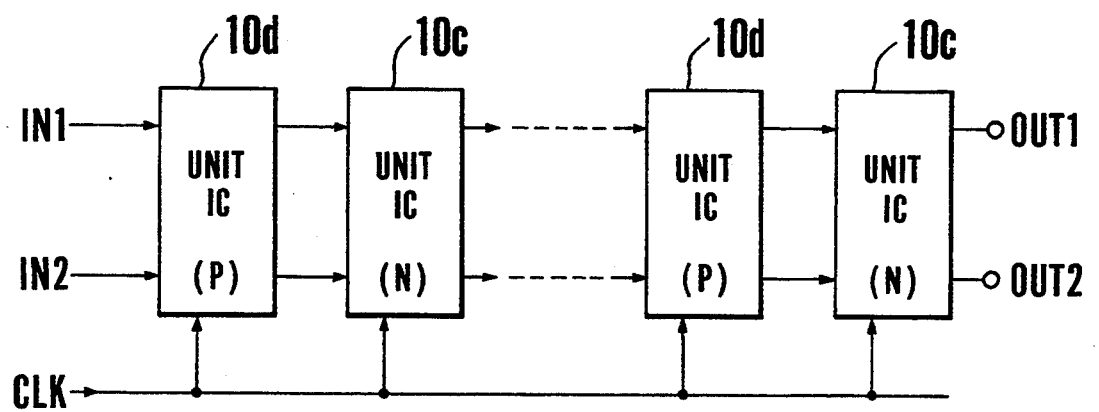
FIG. 9 is a circuit diagram illustrating a pipeline arrangement constructed by cascade-connection of the D flip-flops of FIG. 7.

Referring to FIG. 8, an application is illustrated in the form of a block diagram wherein a semiconductor integrated circuit serving as a pipeline operation is constructed by cascade-connection of a plurality of the D flip-flop of FIG. 7. Herein, symbols of (N) and (P) of the unit integrated circuits 10c and 10d indicate that any logical circuit section and the like are formed with an N type transistor and a P type transistor, respectively. Operation of the semiconductor integrated circuits illustrated in FIGS. 8 and 9 is basically identical to the D flip-flop illustrated in FIGS. 6 and 7, and hence the description thereof is omitted.

In the first embodiment described above, the semiconductor integrated circuit of the present invention comprises the one conductivity type first transistor in which its source electrode is connected with the first reference potential and the clock signal is inputted to its gate, the first logical circuit section formed with the one conductivity type second transistor to which the first input signals corresponding to the gate electrodes are inputted, and connected between the drain electrode of the first transistor and the first output terminal, the second logical circuit section formed with the one conductivity type third transistor to which the second input signals corresponding to the gate electrodes are inputted, and connected between the drain electrode of the first transistor and the second output terminal and taking the complementary logic to the first logical circuit section, and the load circuit composed of the two opposite conductivity type transistors each having the gate electrodes and the drain electrodes both being crossconnected, whereby high speed operation of the circuit and low power consumption are ensured without requiring the inverted clock signal.

In the following, a second embodiment of the present invention will be described. The second embodiment is different from the first one in that two switching transistors for receiving the clock signal, i.e., the two switching transistors are provided and the location of arrangement of those switching transistors is altered.

Figure 10:
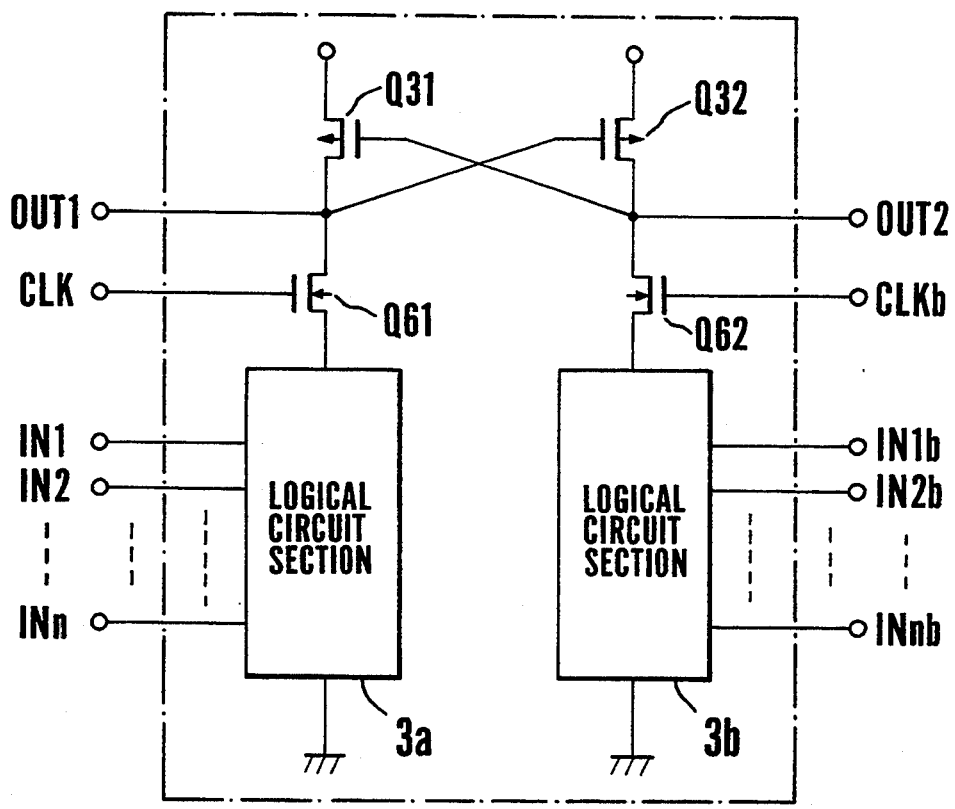
FIG. 10 is a circuit diagram illustrating a second embodiment of the semiconductor integrated circuit according to the present invention.
Figure 11:
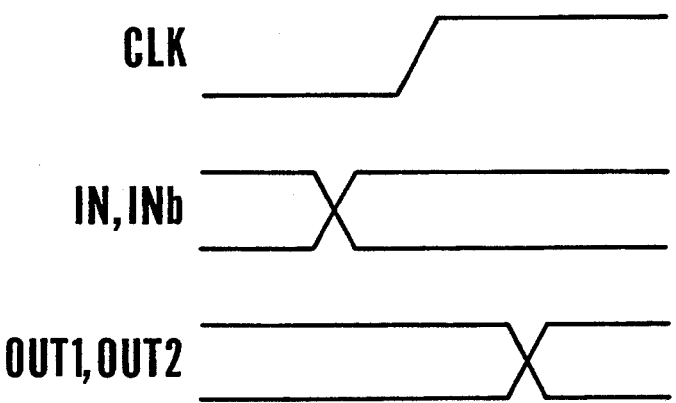
FIG. 11 is a timing chart illustrating a modification of the second embodiment.

Referring to FIGS. 10 and 11, there are illustrated a circuit diagram of the second embodiment and a timing chart of the same.

Designated in the same figures at IN1 through 1Nn are another input signal group and at 1N1b through 1Nnb are an input signal group taking the opposite logic to the former input signal group, Q31 and Q32 are P channel type MOS transistors, 3a and 3b are logical circuit sections formed with N channel type MOS transistors, Q61 and Q62 are N channel type MOS transistors, OUT1 and OUT2 are output terminals on which logically opposite signal levels are outputted, and CLK and CLKb are clock signals each for controlling the operation of the present embodiment.

For the P channel type MOS transistor Q31, its source electrode is connected to VDD (second reference potential) with its gate electrode connected to the output terminal OUT2 and with its drain electrode connected to a source electrode of the N channel type MOS transistor Q62 and to the output terminal OUT2. For the N-channel type transistor Q61, its drain electrode is connected to a drain electrode of the P channel type MOS transistor Q31 and to the output terminal OUT1, with its gate electrode connected with the clock signal CLK and with its source electrode connected with the logical circuit section 3a. For the N channel type transistor Q62, its drain electrode is connected to a drain electrode of the P channel type MOS transistor Q32 and to the output terminal OUT2, with its gate electrode connected to the clock signal CLKb and with its source electrode connected to the logical circuit section 3b. For the logical circuit section 3a, a gate electrode of a constituent N channel type MOS transistor is connected to the input signal group IN1 through INn, with its source electrode and its drain electrode rendered to parallel and series connection with each other and further connected between the source electrode of the N channel type MOS transistor Q61 and the GND (first reference potential). For the logical circuit section 3b, a gate electrode of a constituent N channel type MOS transistor is connected to the input signal group INb, with its source electrode and its drain electrode rendered to parallel and series connection with each other and further connected between a source electrode of the N channel type MOS transistor Q62 and the GND.

When the clock signals CLK and CLKb are of a high level, the N channel type MOS transistors Q61 and Q62 are at an on states. Thereupon, one of the logical circuit sections 3a and 3b electrically connects to the corresponding one of the output terminals and GND with each other, and the other of the logical circuit sections 3a and 3b electrically disconnects the other corresponding one of the output terminals and the GND electrode from each other. It is herein assumed that the logical circuit section 3a is at a conduction state and the logical circuit section 3b is at an on-conduction state where it electrically disconnects the GND electrode and the output terminal OUT2 from each other. The output terminal OUT1 is electrically connected with the GND electrode and hence becomes the low level.

The P channel type MOS transistor Q32 has its gate electrode connected to the output terminal OUT1 and hence is brought into an on state. The output terminal OUT2 is electrically disconnected from the GND electrode by the logical circuit section 3b and hence is brought into a high level. Accordingly, the P channel type MOS transistor Q31 goes to an off state. Therefore two electric paths are existant between the VDD electrode (second reference potential) and the GND electrode (first reference potential): one through the P channel type MOS transistor Q31 and the logical circuit section 3a and the other through the P channel type MOS transistor Q32 and the logical circuit section 3b. Any of those electric paths is electrically disconnected from the one conductivity type MOS transistor, thus so that no steady state current flows. The same operation is attained also when the states of the logical circuit sections 3a and 3b are reversed.

When the clock signals CLK and CLKb are at the low level, the N channel type MOS transistors Q61 and 062 stay at the off state. Accordingly, the respective output terminals OUT1 and OUT2 achieve an electrical disconnection state where they are disconnected from the GND electrode, irrespective of the levels of the input signal groups IN and INb. It is thus impossible to change the output terminals OUT1 and OUT2 to the low level. Further, the P channel type MOS transistors Q31 and Q32 are incapable of being changed in their conduction states through the input signal groups IN and INb. The respective output terminals OUT1 and OUT2 keep dynamic their levels just short of the clock signals CLK and CLKb being changed from the high to low level, with the aid of capacitance possessed by the output terminals OUT1 and OUT2.

Figure 12:
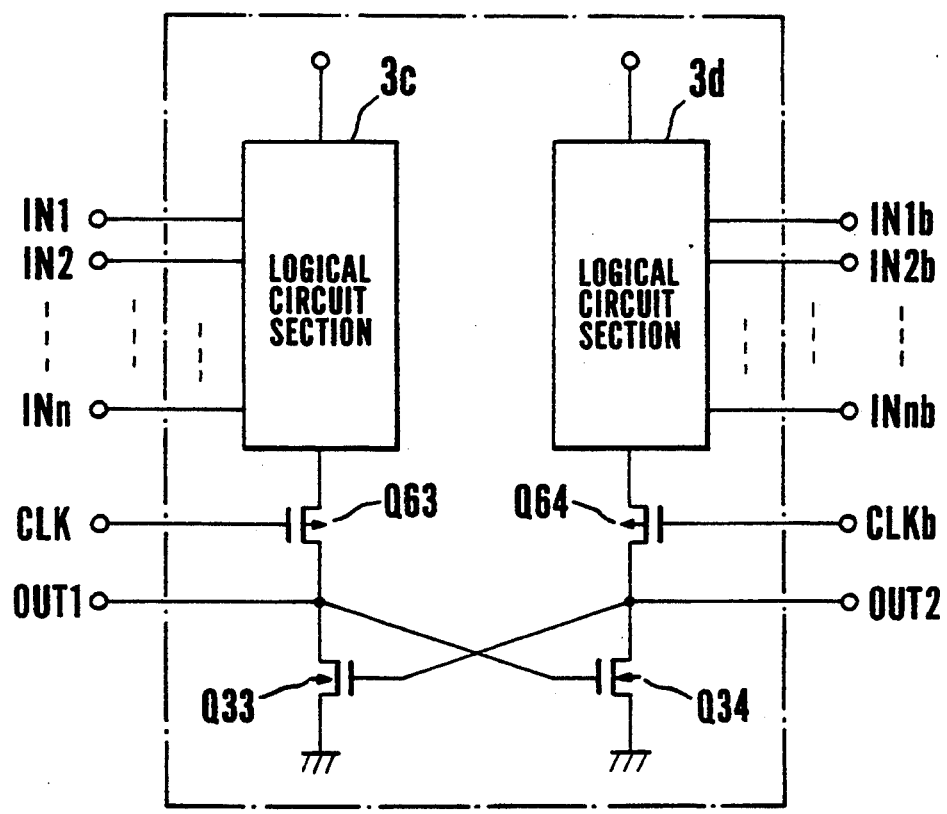
FIG. 12 is a circuit diagram illustrating a modification of the second embodiment of FIG. 10.

Referring to FIG. 12, there is illustrated a circuit diagram of a modification of the above second embodiment.

The present modification is different from the second embodiment shown in FIG. 10 in that the logical circuit sections 3c and 3d are disposed on the side of the second reference potential and the conductivity types of constituent transistors are reversed. Operation of the present modification is identical to the second embodiment and hence further description is omitted.

Figure 13:
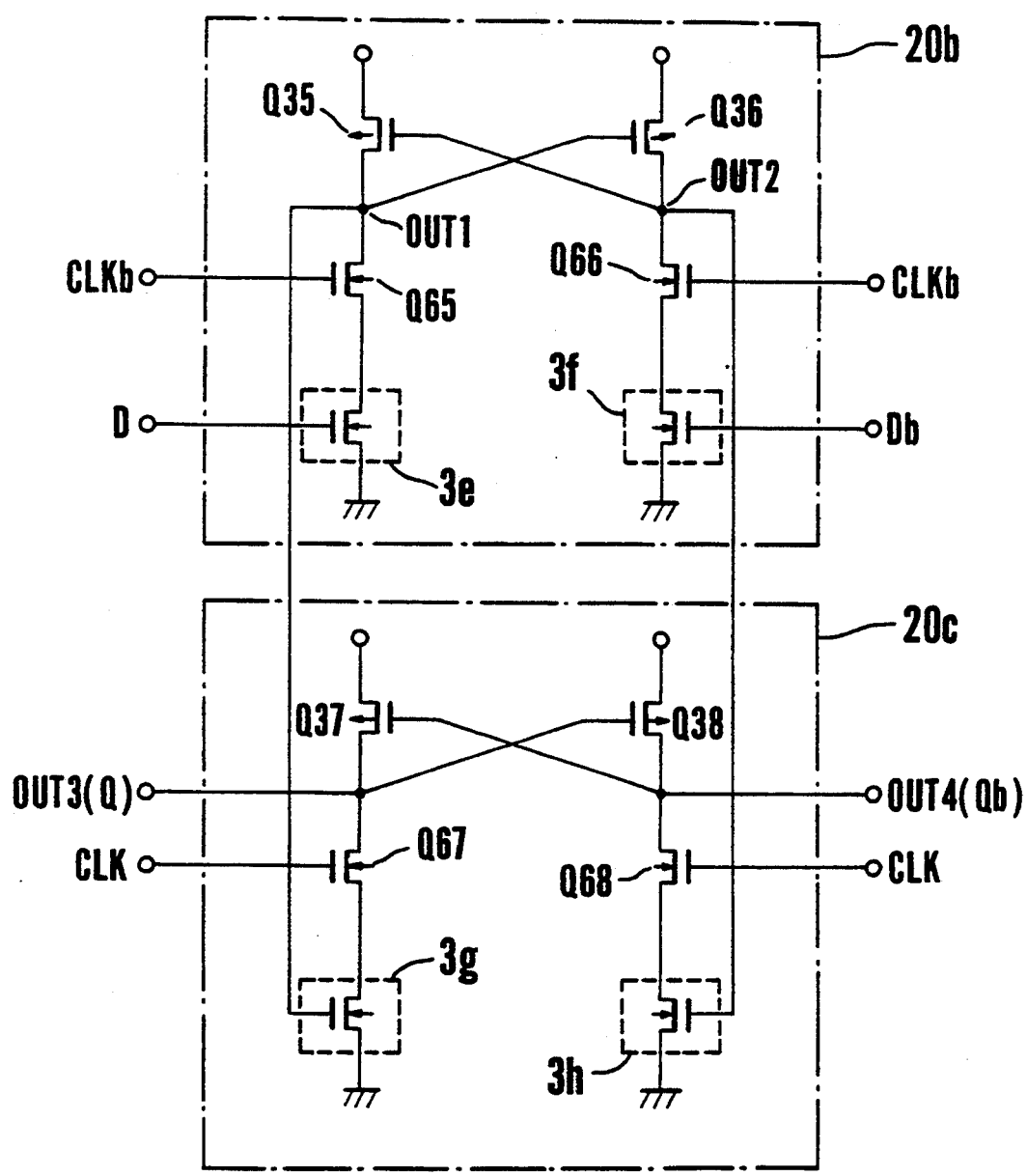
FIG. 13 is a circuit diagram illustrating a D flip-flop constructed by cascade-connection of the two second embodiment circuits.

Referring to FIG. 13, there is illustrated a circuit diagram of an application where a D flip-flop is constructed through cascade-connection of two circuits 20b and 20c of the aforementioned second embodiment.

As illustrated in FIG. 13, designated at D and Db are data inputs to the D flip-flop, Q35 through Q38 are P channel type MOS transistors, 3e through 3h are the MOS transistor groups each formed with N channel type MOS transistors (for each MOS transistor group only one transistor is illustrated by way of example.), Q65 through Q68 are N channel type MOS transistors, OUT1 through OUT4 are output terminals, CLK and CLKb are complementary clock signals for controlling the operation of the present D flip-flop. Outputs of the D flip-flop is derived at output terminals OUT3(Q) and OUT4(Qb). The clock signal CLKb is an inverted signal of the clock signal CLK. The output terminals OUT1 and OUT2 of the circuit 20b are connected to the circuit 20c to provide input signals to the latter circuit 10c. When the clock signal CLK is of a low level, the circuit 20b delivers its output signals to the output terminals OUT1 and OUT2 based upon the input signals D and Db. At this time, the circuit 20c keeps output levels on its output terminals OUT3(Q) and OUT4(Qb) irrespective of the levels of the output signals on the output terminals OUT1 and OUT2 of the circuit 20c. Once the clock signal CLK changes to a high level, the circuit 20c delivers its outputs onto the output terminals OUT3(Q) and OUT4(Qb) in conformity with the output levels in the output terminals OUT1 and OUT2 of the circuit 20b, thereupon, the circuit 20b keeps its output levels dependent upon the levels of the input signals D and Db before the clock signals CLKs change to the high level. Accordingly, when the clock signals CLKs are of the high level, the output levels on the output terminals OUT3(Q) and OUT4(Qb) are kept unchanged even if the levels of the input signals D and Db change.

As described above, the D flip-flop is constructed likewise the first embodiment by cascade-connection of the two circuits of the second embodiment.

Figure 14:
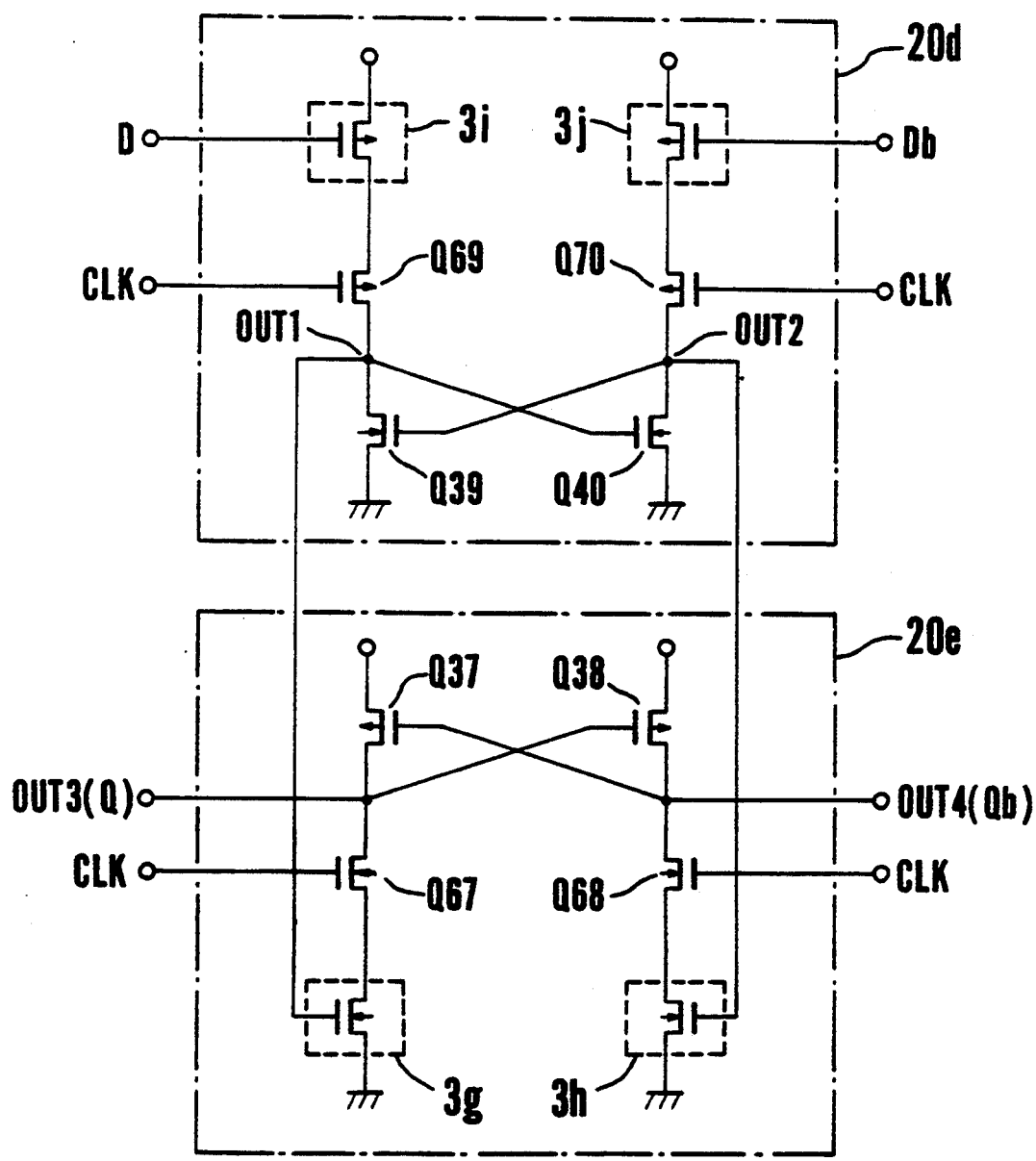
FIG. 14 is a circuit diagram illustrating a D flip-flop constructed in combination of the second embodiment shown in FIG. 10 and the modification of the same shown in FIG. 12.

Referring to FIG. 14, there is illustrated a circuit diagram of an application of the present invention where a D flip-flop is constructed by cascade connection of two circuits 20d and 20e. Designated in the figure at D and Db are data inputs to the instant D flip-flop, Q39 and Q40 are N channel type MOS transistors, Q37 and Q38 are P channel type MOS transistors, 3i and 3j are MOS transistor groups each formed with P channel MOS transistors (only one transistor is illustrated for brevity), 3g and 3h are MOS transistor groups formed with N channel type MOS transistors, Q69 and Q70 are P channel type MOS transistors, Q67 and Q68 are N channel type MOS transistors, OUT1 and OUT2 are output terminals, and CLK is a clock signal for controlling the operation of the operation of the instant D flip-flop, outputs of the D flip-flop are provided on OUT3(Q) and OUT4(Qb). Input signals to the circuit 20e are provided from the output terminals OUT1 and OUT2 of the circuit 20d. Thus, the flip-flop is constructed as in the case of FIG. 13, but without requiring an inverted clock signal CLKb.

Figure 15:
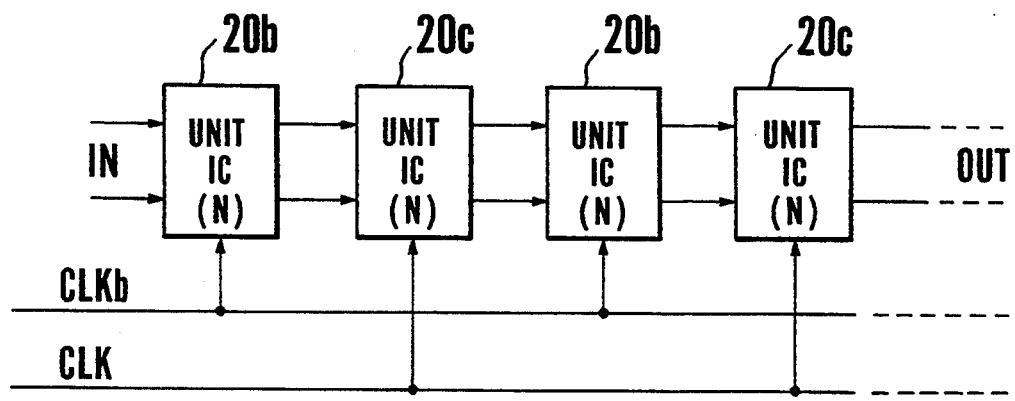
FIG. 15 is a circuit diagram illustrating a pipeline arrangement constructed in cascade-connection of the D flip-flop of FIG. 12.
Figure 16:
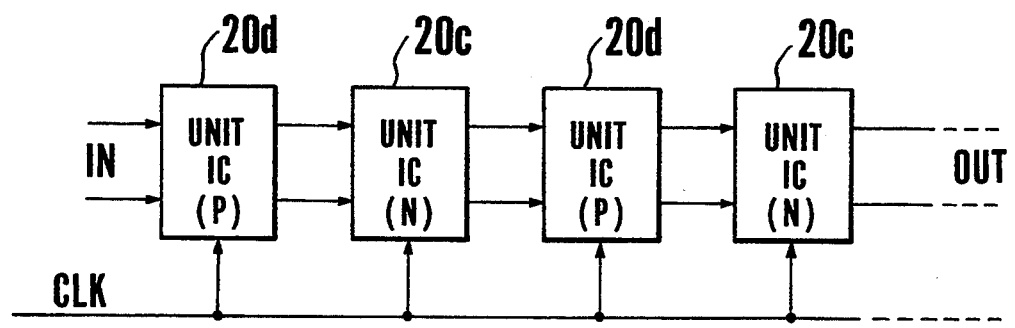
FIG. 16 is a circuit diagram illustrating another pipeline arrangement constructed by cascade-connection of the D flip-flop of FIG. 13.

Referring further to FIGS. 15 and 16, there are illustrated pipe line arrangements constructed through cascade-connection of a plurality of the circuits of the present invention. Designated at 20b and 20c are circuits of the present invention where N channel type MOS transistors are used for the MOS transistor groups. At 20d is a circuit of the present invention where N channel type MOS transistors are used for the MOS transistor group. Operation of both pipeline arrangements described above are identical to those of the cases of the D flip-flops illustrated in FIGS. 13 and 14.

According to the present invention as described above, each input signal is inputted only to a single MOS transistor and hence input capacitance about half those in the prior art cases may be driven to result in high speed operation of the circuit and low power consumption. Further, in the case where the MOS transistor group is formed with N channel type MOS transistors and when the output level is changed to a high level, the change is not achieved by a plurality of the parallel and series connection P channel type MOS transistors as in the prior art cases, but is achieved by a signal P channel type MOS transistor, for high speed operation of the circuit. Additionally an inversed clock signal is not required for controlling the operation of the circuit.

What is claimed is:

1. A semiconductor integrated circuit comprising:
   first and second cross-coupled transistors each having its source/drain path connected to a first voltage potential;
   a first logical circuit section for receiving at least a first input signal, the first logical circuit section being connected to a second voltage potential;
   a second logical circuit section for receiving at least a second input signal complementary to the first input signal, the second logical circuit section being connected to the second voltage potential;
   a third transistor having its source/drain path connected between the source/drain path of the first transistor and the first logical circuit section and having a gate terminal for receiving a first clock signal;
   a fourth transistor having its source/drain path connected between the source/drain path of the second transistor and the second logical circuit section and having a gate terminal for receiving a second clock signal;
   a first output connected to a node between the source/drain path of the first transistor and the source/drain path of the third transistor for outputting a first output signal; and
   a second output node connected to a node between the source/drain path of the second transistor and the source/drain path of the fourth transistor for outputting a second output signal.

2. The semiconductor integrated circuit of claim 1 wherein
   said first and second transistors are P channel type MOS transistors,
   said third and fourth transistors are N channel type MOS transistors, and
   said second voltage potential is a ground potential.

3. The semiconductor integrated circuit of claim 1 wherein
   said first and second transistors are N channel type MOS transistors,
   said third and fourth transistors are P channel type MOS transistors, and
   said first voltage potential is a ground potential.

4. A semiconductor integrated circuit comprising a first portion and a second portion,
   (a) the first portion comprising:
      first and second cross-coupled transistors each having its source/drain path connected to a first voltage potential;
      a first logical circuit section for receiving at least a first input signal, the first logical circuit section being connected to a second voltage potential;
      a second logical circuit section for receiving at least a second input signal complementary to the first input signal, the second logical circuit section being connected to the second voltage potential;
      a third transistor having its source/drain path connected between the source/drain path of the first transistor and the first logical circuit section and having a gate terminal for receiving a first clock signal;
      a fourth transistor having its source/drain path connected between the source/drain path of the second transistor and the second logical circuit section and having a gate terminal for receiving a second clock signal;
      a first output connected to a node between the source/drain path of the first transistor and the source/drain path of the third transistor for outputting a first output signal; and
      a second output node connected to a node between the source/drain path of the second transistor and the source/drain path of the fourth transistor for outputting a second output signal, and
   (b) the second portion comprising:
      fifth and sixth cross-coupled transistors each having its source/drain path connected to a third voltage potential;
      a third logical circuit section for receiving at least the first output signal, the third logical circuit section being connected to a fourth voltage potential;
      a fourth logical circuit section for receiving at least the second output signal, the fourth logical circuit section being connected to the fourth voltage potential;
      a seventh transistor having its source/drain path connected between the source/drain path of the fifth transistor and the third logical circuit section and having a gate terminal for receiving a third clock signal;
      an eighth transistor having its source/drain path connected between the source/drain path of the sixth transistor and the fourth logical circuit section and having a gate terminal for receiving a fourth clock signal;
      a third output connected to a node between the source/drain path of the fifth transistor and the source/drain path of the seventh transistor for outputting a third output signal; and
      a fourth output node connected to a node between the source/drain path of the sixth transistor and the source/drain path of the eighth transistor for outputting a fourth output signal.

5. The semiconductor integrated circuit of claim 4 wherein
   said first and second logical circuit sections each comprise at least one N channel type MOS transistor having a gate terminal for receiving said first and second input signals, respectively,
   said third and fourth logical circuit sections each comprise at least one N channel type MOS transistor having a gate terminal for receiving said first and second output signals, respectively,
   said first, second, fifth, and sixth transistors are P channel type MOS transistors,
   said third, fourth, seventh, and eighth transistors are N channel type MOS transistors, and
   said second and fourth voltage potentials are ground potentials.

6. The semiconductor integrated circuit of claim 4 wherein said first and second logical circuit sections each comprise at least one P channel type MOS transistor having a gate terminal for receiving said first and second input signals, respectively, said third and fourth logical circuit sections each comprise at least one N channel type MOS transistor having a gate terminal for receiving said first and second output signals, respectively, said first, second, seventh, and eighth transistors are N channel type MOS transistors said third, fourth, fifth, and sixth transistors are P channel type MOS transistors, and said first and fourth voltage potentials are ground potentials.

7. The semiconductor integrated circuit of claim 1 wherein said first and second clock signals are in phase with each other.

8. The semiconductor integrated circuit of claim 1 wherein said first and second clock signals have phases complementary to each other.

9. The semiconductor integrated circuit of claim 2 wherein said first and second clock signals are in phase with each other.

10. The semiconductor integrated circuit of claim 3 wherein said first and second clock signals are in phase with each other.

11. The semiconductor integrated circuit of claim 2 wherein said first and second clock signals have phases complementary to each other.

12. The semiconductor integrated circuit of claim 3 wherein said first and second clock signals have phases complementary to each other.

* * * * *

UNITED STATES PATENT AND TRADEMARK OFFICE
CERTIFICATE OF CORRECTION

PATENT NO. : 5,384,493
DATED : January 24, 1995
INVENTOR(S) : Katsuya Furuki

It is certified that error appears in the above-indentified patent and that said Letters Patent is hereby corrected as shown below:

Col. 2, line 18 delete "required" insert --necessary--.

Col. 7, line 2 delete "if" insert --1f--.

Col. 9, line 5 delete "an"

Col. 9, line 38 delete "O62" insert --Q62--

Signed and Sealed this

Thirty-first Day of October 1995

Attest:

BRUCE LEHMAN

Attesting Officer

Commissioner of Patents and Trademarks